(12) United States Patent
Bratkovski et al.

(10) Patent No.: US 8,120,071 B2
(45) Date of Patent: Feb. 21, 2012

(54) MEMFET RAM

(75) Inventors: Alexandre M. Bratkovski, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 276 days.

(21) Appl. No.: 12/685,494

(22) Filed: Jan. 11, 2010

(65) Prior Publication Data
US 2011/0169052 A1 Jul. 14, 2011

(51) Int. Cl.
  H01L 29/80 (2006.01)
  H01L 31/112 (2006.01)
  H01L 29/792 (2006.01)
(52) U.S. Cl. ........................... 257/262; 257/324
(58) Field of Classification Search .......... 257/261–267, 257/314–326, E29.31, E27.059
See application file for complete search history.

(56) References Cited

U.S. PATENT DOCUMENTS

| | | | | |
|---|---|---|---|---|
| 6,740,928 | B2 * | 5/2004 | Yoshii et al. | 257/315 |
| 7,301,197 | B2 * | 11/2007 | Lojek | 257/322 |
| 2008/0217683 | A1 * | 9/2008 | Jeng | 257/325 |
| 2009/0302365 | A1 * | 12/2009 | Bhattacharyya | 257/298 |

* cited by examiner

Primary Examiner — Cuong Q Nguyen

(57) ABSTRACT

A non-volatile field-effect device. The non-volatile field-effect device includes a source, a drain, a channel-formation portion and a memristive gate. The channel-formation portion is disposed between and coupled with the source and the drain. The memristive gate is disposed over the channel-formation portion and coupled with the channel-formation portion. The memristive gate includes a plurality of mobile ions and a confinement structure for the plurality of mobile ions. Moreover, the memristive gate is configured to switch the channel-formation portion from a first conductivity state to a second conductivity state in response to migration of the plurality of mobile ions within the confinement structure.

15 Claims, 6 Drawing Sheets

MEMFET RAM

TECHNICAL FIELD

Embodiments of the present invention relate generally to the field of random access memories (RAMs), integrated circuits (ICs), memory cells, and a non-volatile field-effect device including a memristive gate.

BACKGROUND

The burgeoning growth of the information storage industry creates ever increasing demands on the integrity and preservation of data stored in information-storage systems. In particular, means for storing information in non-volatile electronic devices and development of non-volatile electronic memories utilizing such non-volatile electronic devices has taken on an increasingly more prominent role in satisfying these demands.

Scientists engaged in the research and development of non-volatile electronic memories such as RAMs based on ICs are keenly interested in finding new means for storing information in non-volatile electronic devices. Thus, research scientists are actively pursuing new approaches for meeting these demands.

DESCRIPTION OF THE DRAWINGS

The accompanying drawings, which are incorporated in and form a part of this specification, illustrate embodiments of the technology and, together with the description, serve to explain the embodiments of the technology.

Figure 1:
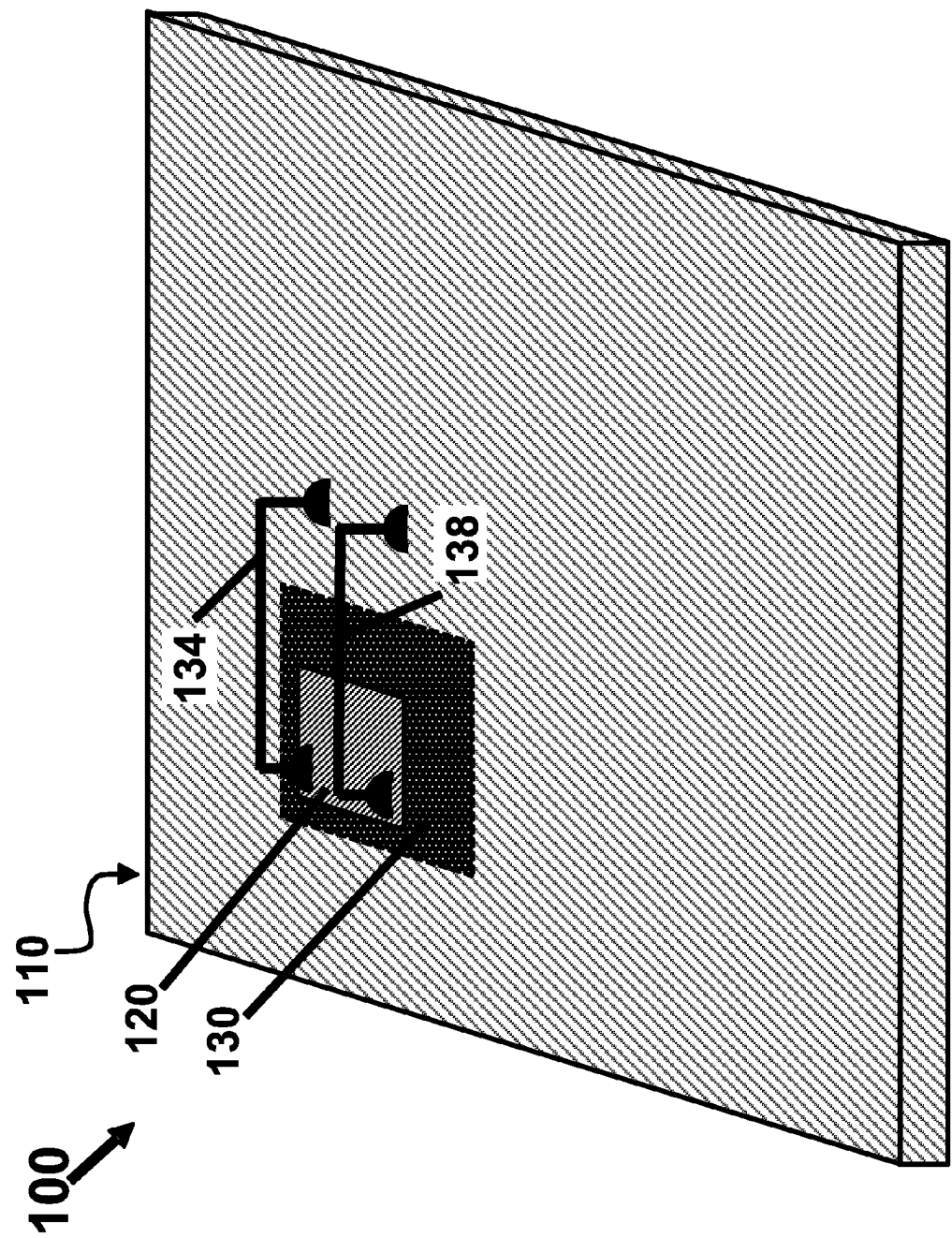
FIG. 1 is a perspective view of a non-volatile random access memory illustrating an example environment in which a non-volatile field-effect device finds particular utility, as well as further illustrating the functional arrangement of the non-volatile field-effect device in a non-volatile memory cell of the non-volatile random access memory, in an embodiment of the present invention.

The drawings referred to in this description should not be understood as being drawn to scale except if specifically noted.

DESCRIPTION OF EMBODIMENTS

Reference will now be made in detail to the alternative embodiments of the present invention. While the technology will be described in conjunction with the alternative embodiments, it will be understood that they are not intended to limit the technology to these embodiments. On the contrary, the technology is intended to cover alternatives, modifications and equivalents, which may be included within the spirit and scope of the technology as defined by the appended claims.

Furthermore, in the following description of embodiments of the present invention, numerous specific details are set forth in order to provide a thorough understanding of the present invention. However, it should be noted that embodiments of the present invention may be practiced without these specific details. In other instances, well known methods, procedures, and components have not been described in detail as not to unnecessarily obscure embodiments of the present invention. Throughout the drawings, like components are denoted by like reference numerals, and repetitive descriptions are omitted for clarity of explanation if not necessary.

Embodiments of the present invention include a non-volatile field-effect device. The non-volatile field-effect device includes a source, a drain, a channel-formation portion and a memristive gate. The channel-formation portion is disposed between and coupled with the source and the drain. The memristive gate is disposed over the channel-formation portion and coupled with the channel-formation portion. The memristive gate includes a plurality of mobile ions and a confinement structure for the plurality of mobile ions. Moreover, the memristive gate is configured to switch the channel-formation portion from a first conductivity state to a second conductivity state in response to migration of the plurality of mobile ions within the confinement structure.

With reference now to FIG. 1, in accordance with an embodiment of the present invention, a perspective view 100 of a non-volatile random access memory (RAM) 110 is shown. FIG. 1 also illustrates the functional arrangement of a non-volatile field-effect device 120, a non-volatile memory cell 130 and the non-volatile RAM 110, by way of example without limitation thereto, as other example environments such as integrated circuits (ICs), also known by the term of art "chips," are also within the spirit and scope of embodiments of the present invention. FIG. 1 illustrates an example environment in which the non-volatile field-effect device 120 finds particular utility. In particular, embodiments of the present invention for the non-volatile field-effect device 120, which are subsequently described in greater detail, apply to and may be incorporated within the environment of the non-volatile RAM 110, as well as the non-volatile memory cell 130. As shown in FIG. 1, the non-volatile memory cell 130 includes at least one non-volatile field-effect device 120, by way of example without limitation thereto, as embodiments of the present invention encompass within their spirit and scope other arrangements in which the non-volatile memory cell 130 includes more that one non-volatile field-effect device 120. Moreover, as shown in FIG. 1, the non-volatile RAM 110 includes at least one non-volatile memory cell 130, by way of example without limitation thereto, as embodiments of the present invention encompass within their spirit and scope other arrangements in which the non-volatile RAM 110 includes more that one non-volatile memory cell 130. Therefore, in accordance with an embodiment of the present invention, the non-volatile RAM 110 also includes at least one non-volatile field-effect device 120. The non-volatile field-effect device 120 includes a plurality of portions (not shown in FIG. 1, but shown in and later described in the discussion of FIGS. 2 through 6).

With further reference to FIG. 1, in accordance with an embodiment of the present invention, the non-volatile memory cell 130 includes at least one non-volatile field-effect device 120, at least one input lead 134 and at least one output lead 138. As shown in FIG. 1, the non-volatile memory cell 130 is coupled to non-volatile RAM 110 through leads 134 and 138, by way of example without limitation thereto. Although in FIG. 1 the lines are shown as running over the top of non-volatile RAM 110, the arrangement is schematic and shown by way of example without limitation thereto, as embodiments of the present invention encompass within their spirit and scope other arrangements, for example, where the leads 134 and 138 are disposed within the body of the non-volatile RAM 110, and integrated within the circuitry of the non-volatile RAM 110, as is known in the art of IC technology. The input lead 134 may be coupled to a memristive gate of the non-volatile field-effect device 120; and, the output lead may be coupled to either one of a source or a drain of the non-volatile field-effect device 120, as is next described in greater detail.

Figure 2:
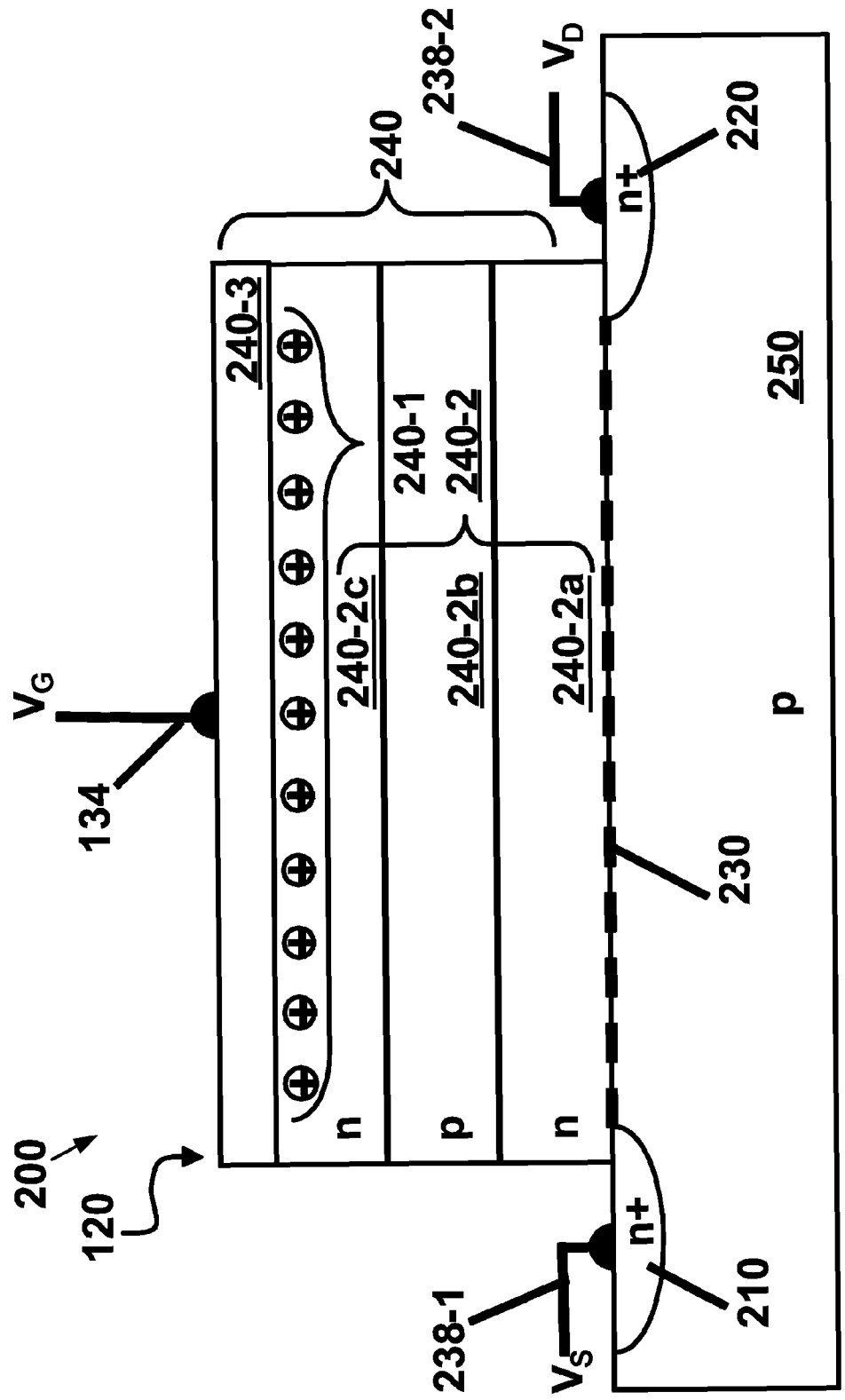
FIG. 2 is a cross-sectional elevation view of an example non-volatile field-effect device illustrating the functional arrangement of a source, a drain, a channel-formation portion and a memristive gate in the non-volatile field-effect device, and further illustrating location of a plurality of mobile ions in a confinement structure of the memristive gate for a low conductivity state of the channel-formation portion, in an embodiment of the present invention.

With reference now to FIG. 2, in accordance with an embodiment of the present invention, a cross-sectional elevation view 200 of an example non-volatile field-effect device 120 is shown. FIG. 2 also illustrates the functional arrangement of a source 210, a drain 220, a channel-formation portion 230 (indicated by the heavy dashed line) and a memristive gate 240 in the non-volatile field-effect device 120. FIG. 2 further illustrates location of a plurality of mobile ions 240-1 in a confinement structure 240-2 of the memristive gate 240 for a low conductivity state of the channel-formation portion 230. The non-volatile field-effect device 120 includes the source 210, the drain 220, the channel-formation portion 230 and the memristive gate 240. The channel-formation portion 230 is disposed between and coupled with the source 210 and the drain 220. The memristive gate 240 is disposed over the channel-formation portion 230 and coupled with the channel-formation portion 230. The memristive gate 240 includes the plurality of mobile ions 240-1 and the confinement structure 240-2 for the plurality of mobile ions 240-1. Moreover, the memristive gate 240 is configured to switch the channel-formation portion 230 from a first conductivity state to a second conductivity state in response to migration of the plurality of mobile ions 240-1 within the confinement structure 240-2. The non-volatile field-effect device 120 is configured as a field-effect transistor (FET) with the memristive gate 240, referred to herein as a "MEMFET," a term of art coined by the inventors. As shown in FIG. 1, the non-volatile field-effect device 120 is configured as an n-channel enhancement mode FET, by way of example without limitation thereto, as other FET configurations are also within the spirit and scope of embodiments of the present invention, such as: a p-channel enhancement mode FET, a n-channel depletion mode FET, a p-channel depletion mode FET, junction field-effect transistors (JFETs), as well as other FET device configurations, wherein a memristive gate 240 may be incorporated. The first conductivity state may be a high conductivity state, in which case the second conductivity state is a low conductivity state. Alternatively, the first conductivity state may be a low conductivity state, in which case the second conductivity state is a high conductivity state. The nature of the conductivity state produced depends on the influence of the plurality of mobile ions 240-1 on the channel-formation portion of the FET, which in turn depends on the type of FET in which the memristive gate 240 is incorporated. Thus, as used herein, the channel-formation portion may be a doped channel as in a depletion mode FET, or alternatively, a channel-formation portion that forms a channel with inversion of a surface layer upon the accumulation of minority carriers as in an enhancement mode FET. Moreover, the source 210, the drain 220 and the channel-formation portion 230 are fabricated in a substrate 250. In accordance with embodiments of the present invention, the substrate may include a substrate material selected from the group consisting of silicon, gallium arsenide, indium antimonide, and silicon germanium, by way of example without limitation thereto.

With further reference to FIG. 2, in accordance with an embodiment of the present invention, the memristive gate 240 further includes a gate electrode 240-3, and the confinement structure 240-2. The confinement structure 240-2 includes a first portion 240-2a, a second portion 240-2b, and a third portion 240-2c. The first portion 240-2a is disposed in proximity to the channel-formation portion 230. The second portion 240-2b is disposed between the first portion and the third portion. The third portion 240-2c is disposed in proximity to the gate electrode 240-3. The first portion 240-2a and the third portion 240-2c include memristive semiconductors doped to produce portions of a first conductivity type; and, the second portion 240-2b includes a memristive semiconductor doped to produce a portion of a second conductivity type. Thus, in accordance with an embodiment of the present invention, the confinement structure 240-2 may include a semiconductor heterojunction structure.

For example, with further reference to FIG. 2, in accordance with an embodiment of the present invention, the first portion 240-2a and the third portion 240-2c may include titanium oxide doped with sodium; and the second portion 240-2b may include titanium oxide doped with nickel oxide, thus, forming a semiconductor heterojunction structure. For such a confinement structure 240-2, in accordance with an embodiment of the present invention, the confinement structure 240-2 includes: the first portion 240-2a including a n-doped memristive semiconductor; the second portion 240-2b including a p-doped memristive semiconductor; and the third portion 240-2c including a n-doped memristive semiconductor. Alternatively, in accordance with another embodiment of the present invention, the confinement structure 240-2 may include: a first portion 240-2a that may include a p-doped memristive semiconductor (not shown); a second portion 240-2b that may include a n-doped memristive semiconductor (not shown); and a third portion 240-2c that may include a p-doped memristive semiconductor (not shown). In accordance with embodiments of the present invention, the confinement structure 240-2 may include at least one memristive semiconductor selected from the group consisting of titanium oxide, nickel oxide, zirconium oxide, hafnium oxide, strontium titanate, gallium nitride and cuprous chloride. Memristive semiconductors, including oxides such as: titanium oxide, nickel oxide, zirconium oxide, hafnium oxide, and strontium titanate, may be used as portions of the memristive gate 240, in which case the non-volatile field-effect device 120 may be configured as a metal-oxide-semiconductor field-effect transistor (MOSFET).

With further reference to FIG. 2, in accordance with an embodiment of the present invention, when a gate bias voltage, $V_G$, is applied to the gate electrode 240-3 through the input lead 134, the plurality of mobile ions 240-1 may be induced to move into one or the other of the first portion 240-2a or the third portion 240-2c of the confinement structure 240-2 of the memristive gate 240. Neglecting any substrate bias potentials, for the sake of simplicity, if the gate bias voltage, $V_G$, is negative, the plurality of mobile ions 240-1 that are positively charged will be attracted to the gate electrode 240-3, as shown in FIG. 2, which is the case for mobile ions such: as lithium ions, or alternatively, hydrogen ions, for example, in titanium oxide; under circumstances of an applied, negative gate bias voltage, $V_G$, the plurality of positively charged mobile ions 240-1 becomes confined within the third portion 240-2c of the confinement structure 240-2 of the memristive gate 240. A source lead 238-1 and a drain lead 238-2 are used to apply a potential across the source 210 and the drain 220 to produce a current flow through the channel-formation portion 230 of the non-volatile field-effect device 120; the potential applied across the channel-formation portion 230 is the difference between the drain voltage, $V_D$, applied to the drain 220 through the drain lead 238-2 and the source voltage, $V_S$, applied to the source 210 through the source lead 238-1, such that the drain voltage, $V_D$, is greater than the source voltage, $V_S$. In accordance with embodiments of the present invention, the output lead 138 may be either one of the source lead 238-1, or alternatively, the drain lead 238-2, depending upon the circuit design in which the non-volatile field-effect device 120 is incorporated. As shown in FIG. 2, in accordance with embodiments of the present invention, negligible current flows between the source 210 and the drain 220 with application of the potential across the source 210 and the drain 220, because no channel is formed between the source 210 and the drain 220 in the non-volatile field-effect device 120 configured as an n-channel enhancement mode FET. Thus, for a non-negligible current to flow between the source 210 and the drain 220, a potential is applied across the source 210 and the drain 220, and a channel exists between the source 210 and the drain 220 of the non-volatile field-effect device 120 configured as the n-channel enhancement mode FET, as is next described.

Figure 3:
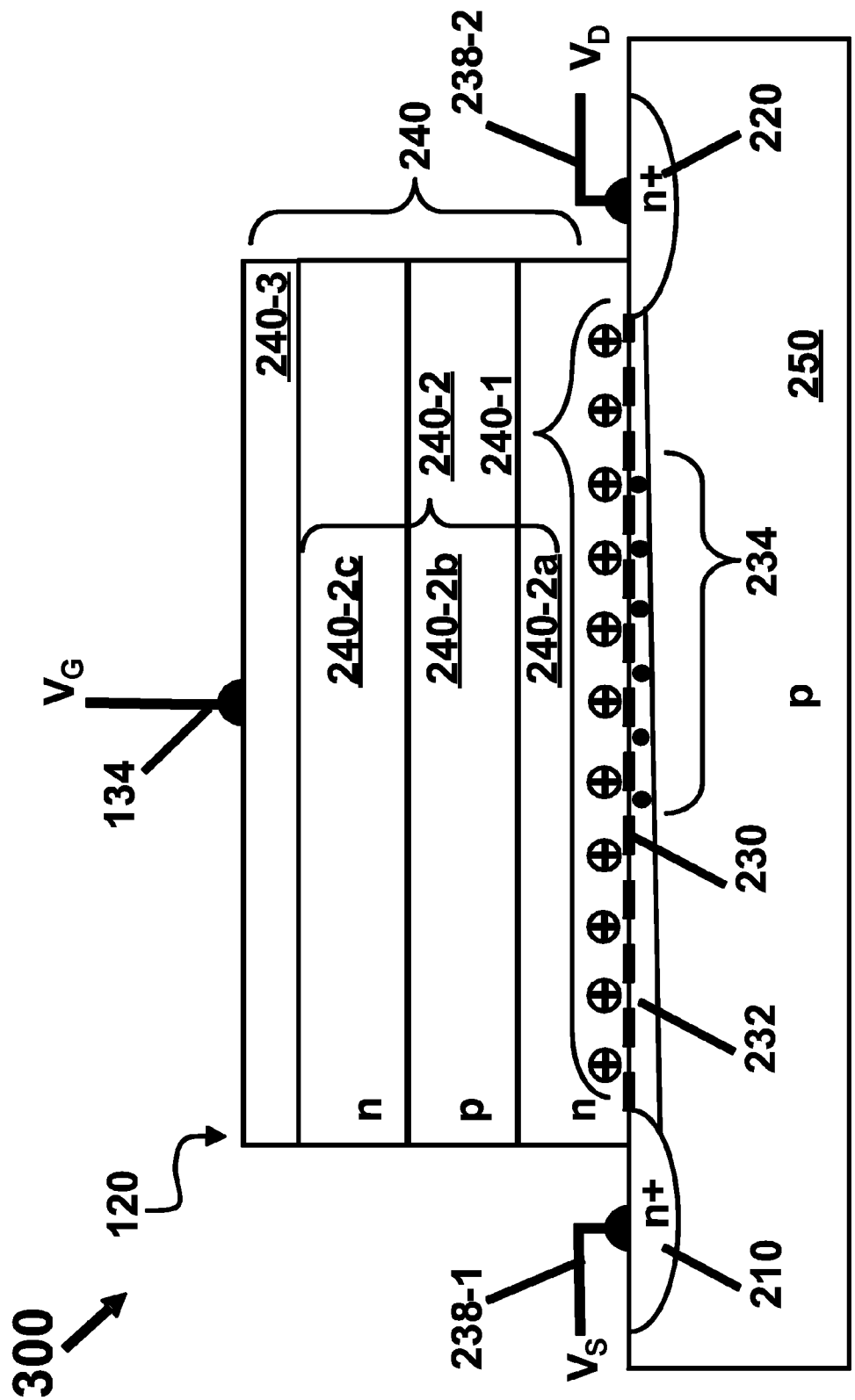
FIG. 3 is a cross-sectional elevation view of an example non-volatile field-effect device illustrating the functional arrangement of a source, a drain, a channel-formation portion and a memristive gate in the non-volatile field-effect device, and further illustrating location of a plurality of mobile ions in the confinement structure of the memristive gate for a high conductivity state of the channel-formation portion such that the plurality of mobile ions induces the formation of a surface inversion layer, or "channel," with the accumulation of minority carriers in the channel, in an embodiment of the present invention.

With reference now to FIG. 3, in accordance with an embodiment of the present invention, a cross-sectional elevation view 300 of the example non-volatile field-effect device 120 of FIG. 2 is shown including a channel 232. Components of the non-volatile field-effect device 120 shown in FIG. 3 are denoted by reference numerals of components previously described in FIG. 2. FIG. 3 illustrates the functional arrangement of the source 210, the drain 220, the channel-formation portion 230 (indicated by the heavy dashed line) and the memristive gate 240 in the non-volatile field-effect device 120 with the formation of the channel 232. FIG. 3 further illustrates location of a plurality of mobile ions 240-1 in the confinement structure 240-2 of the memristive gate 240 for a high conductivity state of the channel-formation portion 230 such that the plurality of mobile ions 240-1 induces the formation of a surface inversion layer, or "channel," with the accumulation of minority carriers in the channel 232. Neglecting any substrate bias potentials, for the sake of simplicity, if the gate bias voltage, $V_G$, is positive, the plurality of mobile ions 240-1 that are positively charged will be repelled from the gate electrode 240-3, as shown in FIG. 3, which is the case for mobile ions such: as lithium ions, or alternatively, hydrogen ions, for example, in titanium oxide; under circumstances of an applied, positive gate bias voltage, $V_G$, the plurality of positively charged mobile ions 240-1 becomes confined within the first portion 240-2a of the confinement structure 240-2 of the memristive gate 240. In accordance with embodiments of the present invention, the plurality of charged mobile ions 240-1 that are confined within the first portion 240-2a of the confinement structure 240-2 of the memristive gate 240 attract a plurality of minority carriers 234, which are electrons in the case of a substrate 250 that is p-type; the plurality of minority carriers 234 accumulate at the surface of the substrate 250 forming a surface inversion layer, referred to by the term of art, channel 232, for the non-volatile field-effect device 120 configured as the n-channel enhancement mode FET. Thus, in accordance with embodiments of the present invention, a high conductivity state of the channel-formation portion 230 is produced by the channel 232 in the channel-formation portion 230 of the non-volatile field-effect device 120 configured as the n-channel enhancement mode FET. The source lead 238-1 and the drain lead 238-2 are used to apply a potential across the source 210 and the drain 220 and produce a current flow through the channel 232 in the channel-formation portion 230 of the non-volatile field-effect device 120; the potential applied across the channel 232 is the difference between the drain voltage, $V_D$, applied to the drain 220 through the drain lead 238-2 and the source voltage, $V_S$, applied to the source 210 through the source lead 238-1, such that the drain voltage, $V_D$, is greater than the source voltage, $V_S$. As shown in FIG. 3, in accordance with embodiments of the present invention, a substantial current flows between the source 210 and the drain 220 with application of the potential across the source 210 and the drain 220, because the channel 232 is formed between the source 210 and the drain 220 in the non-volatile field-effect device 120 configured as an n-channel enhancement mode FET, by way of example without limitation thereto.

In the alternative, in accordance with other embodiments of the present invention, a plurality of mobile ions may be negative ions. By way of one prophetic embodiment of the inventors for the present invention, the negative ions might be fluorine ions, or alternatively, other high mobility negative ions, in a confinement structure of a memristive gate. Neglecting any substrate bias potentials, for the sake of simplicity, if the gate bias voltage, $V_G$, is positive, the plurality of mobile ions that are negatively charged (not shown) will be attracted to the gate electrode 240-3; under circumstances of an applied, positive gate bias voltage, $V_G$, the plurality of negatively charged mobile ions (not shown) would become confined within the third portion 240-2c of the confinement structure 240-2 of the memristive gate 240. In accordance with embodiments of the present invention, if a potential is applied across the channel-formation portion 230 between the source 210 and the drain 220, negligible current would flow between the source 210 and the drain 220, because no channel is formed between the source 210 and the drain 220 in the non-volatile field-effect device 120 configured as an p-channel enhancement mode FET. On the other hand, neglecting any substrate bias potentials, for the sake of simplicity, if the gate bias voltage, $V_G$, is negative, the plurality of mobile ions that are negatively charged (not shown) will be repelled from the gate electrode 240-3; under circumstances of an applied, negative gate bias voltage, $V_G$, the plurality of negatively charged mobile ions (not shown) becomes confined within the first portion 240-2a of the confinement structure 240-2 of the memristive gate 240. Under these circumstances, the plurality of charged mobile ions that are confined within the first portion 240-2a of the confinement structure 240-2 of the memristive gate 240 attract a plurality of minority carriers 234, which are holes (not shown) in the case of a substrate 250 that is n-type; the plurality of minority carriers 234 accumulate at the surface of the substrate 250 forming a surface inversion layer, which is channel 232, for the non-volatile field-effect device 120 configured as the p-channel enhancement mode FET. In accordance with embodiments of the present invention, if a potential is applied across the channel-formation portion 230 between the source 210 and the drain 220, a substantial current would flow between the source 210 and the drain 220, because a channel is formed between the source 210 and the drain 220 in the non-volatile field-effect device 120 configured as a p-channel enhancement mode FET, where the substrate 250 is a n-type semiconductor (not shown), by way of example without limitation thereto.

Moreover, in accordance with other embodiments of the present invention, a non-volatile field-effect device 120 configured as a n-channel depletion mode FET, or alternatively, a p-channel depletion mode FET are also within the spirit and scope of embodiments of the present invention, although the details of operation would differ from those described above. Namely, for depletion mode devices, the channel-formation portion 230 of the non-volatile field-effect device 120 would include a channel pre-fabricated in the substrate 250 as a thin doped surface layer, typically provided by implanting dopant species of opposite type to those of the substrate 250. Correspondingly, the effects of an applied gate bias voltage, $V_G$, may serve to deplete the channel of charge carriers. The primary difference between the enhancement mode devices described above and depletion mode devices is that: the conductivity state of the channel-formation portion 230 is a high conductivity state even in the absence of an applied gate bias voltage, $V_G$, to the gate electrode 240-3, because of the presence of the pre-fabricated channel in the substrate 250; and, the conductivity state of the channel-formation portion 230 is a low conductivity state with the presence of an applied gate bias voltage, $V_G$, on the gate electrode 240-3, because of the depletion of carriers from the pre-fabricated channel in the substrate 250 with application of the gate bias voltage, $V_G$.

Figure 4:
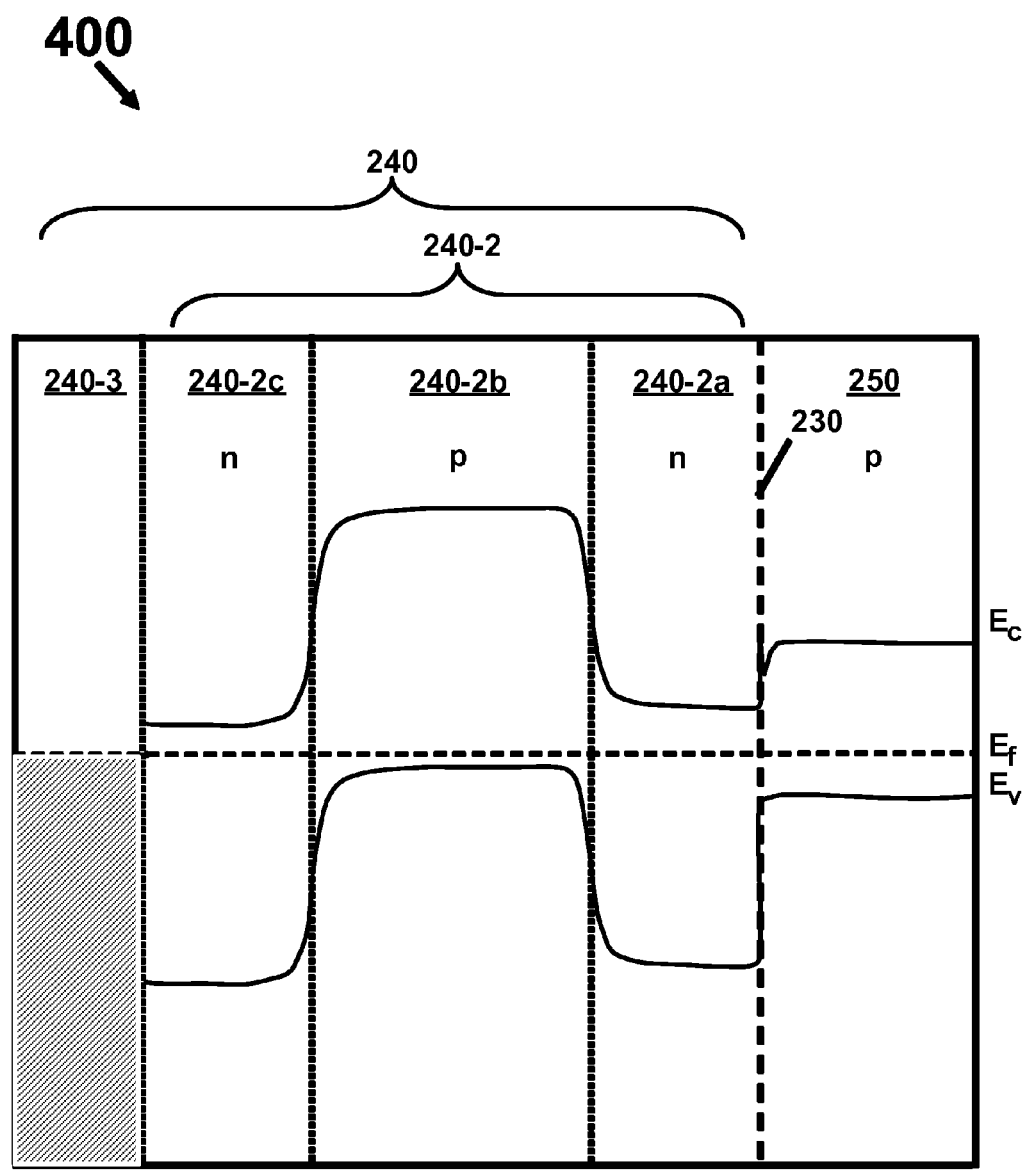
FIG. 4 is a cross-sectional elevation view of the channel-formation portion and the memristive gate in the example non-volatile field-effect device of FIGS. 2 and 3 illustrating a band diagram showing the band structure of the confinement structure of the memristive gate in the example non-volatile field-effect device, in an embodiment of the present invention.

With reference now to FIG. 4, in accordance with an embodiment of the present invention, a cross-sectional elevation view 400 of the channel-formation portion 230 (indicated by the heavy dashed line) and the memristive gate 240 of the example non-volatile field-effect device 120 of FIGS. 2 and 3 is shown that is useful in describing the non-volatility of the non-volatile field-effect device 120. Components of the non-volatile field-effect device 120 shown in FIG. 4 are denoted by reference numerals of components previously described in FIGS. 2 and 3. FIG. 4 illustrates a band diagram showing band structure of the confinement structure 240-2 of the memristive gate 240 in the example non-volatile field-effect device 120 of FIGS. 2 and 3. In accordance with an embodiment of the present invention, for each portion of the memristive gate 240 and the channel-formation portion 230, the band diagram shows, by way of example without limitation thereto: the conduction-band minimum at energy, $E_C$, the valence-band maximum at energy, $E_V$, and the Fermi energy, $E_f$. As shown in FIG. 4, the memristive gate 240 includes the gate electrode 240-3, and the confinement structure 240-2. The confinement structure 240-2 includes the first portion 240-2a, the second portion 240-2b, and the third portion 240-2c. The first portion 240-2a is disposed in proximity to the channel-formation portion 230 of the substrate 250 of the non-volatile field-effect device 120. As shown in FIG. 4, the junction between the first portion 240-2a and the channel-formation portion 230 of the substrate 250 is a heterojunction because the band gap of the first portion 240-2a, which is a semiconducting oxide, for example, titanium oxide, is wider than the band gap of the substrate 250, which is an semiconductor, for example, silicon. Band bending in the vicinity of the junction between the first portion 240-2a and the channel-formation portion 230 of the substrate 250 is also evident for the conduction and valence bands of the channel-formation portion 230 of the substrate 250. Since the first portion 240-2a is titanium oxide n-doped with sodium, the Fermi energy, $E_f$, is disposed closer to the conduction-band minimum at energy, $E_C$, than valence-band maximum at energy, $E_V$. Similarly, since the substrate 250 is p-doped silicon, the Fermi energy, $E_f$, is disposed closer to the valence-band maximum at energy, $E_V$, than the conduction-band minimum at energy, $E_C$.

With further reference to FIG. 4, in accordance with an embodiment of the present invention, the second portion 240-2b is disposed between the first portion 240-2a and the third portion 240-2c. As shown in FIG. 4, the junction between the first portion 240-2a and the second portion 240-2b is also a heterojunction because the band gap of the first portion 240-2a, which is a semiconducting oxide, for example, titanium oxide, is different from the band gap of the second portion 240-2b, which is a semiconducting oxide of different composition, for example, titanium oxide doped with nickel oxide. Similarly, the junction between the third portion 240-2c and the second portion 240-2b is a heterojunction because the band gap of the third portion 240-2c, which is a semiconducting oxide, for example, titanium oxide, is different from the band gap of the second portion 240-2b, which is a semiconducting oxide of different composition, for example, titanium oxide doped with nickel oxide. The third portion 240-2c is disposed in proximity to the gate electrode 240-3. As shown in FIG. 4, the junction between the third portion 240-2c and the metal gate electrode 240-3 is a metal-semiconductor junction as indicated by the Fermi energy, $E_f$, of the third portion 240-2c joining with the Fermi energy, $E_f$, at the top of the conduction band (indicated by the hatching in FIG. 4) of the metal of the metal gate electrode 240-3. Because the first portion 240-2a and the third portion 240-2c include memristive semiconductors doped to produce portions of a first conductivity type, and the second portion 240-2b includes a memristive semiconductor doped to produce a portion of a second conductivity type, potential barriers exist at the junction between the first portion 240-2a and the second portion 240-2b and at the junction between the second portion 240-2b and the third portion 240-2c. The potential barriers provide for confinement of the plurality of mobile ions 240-1 in the first portion 240-2a, or alternatively, the third portion 240-2c of the confinement structure 240-2 depending upon whether a gate bias voltage, $V_G$, has been applied to the gate electrode repelling, or alternatively, attracting the plurality of mobile ions 240-1 to one or the other of the first portion 240-2a, or alternatively, the third portion 240-2c, which depends on the charge state of the ions, as described above. In accordance with an embodiment of the present invention, for the example non-volatile field-effect device 120 of FIGS. 2 and 3 configured as an n-channel enhancement mode FET, and a plurality of mobile ions 240-1 that are positively charged, a gate bias voltage, $V_G$, applied to the gate electrode 240-3 repels, or alternatively, attracts, the plurality of mobile ions 240-1 to the first portion 240-2a, or alternatively, the third portion 240-2c, respectively, and the potential barriers confines the plurality of mobile ions 240-1 within the first portion 240-2a, or alternatively, the third portion 240-2c, respectively, after the gate bias voltage, $V_G$, has been removed, creating a non-volatile memory state in the non-volatile field-effect device 120, as is next described in greater detail.

Figure 5:
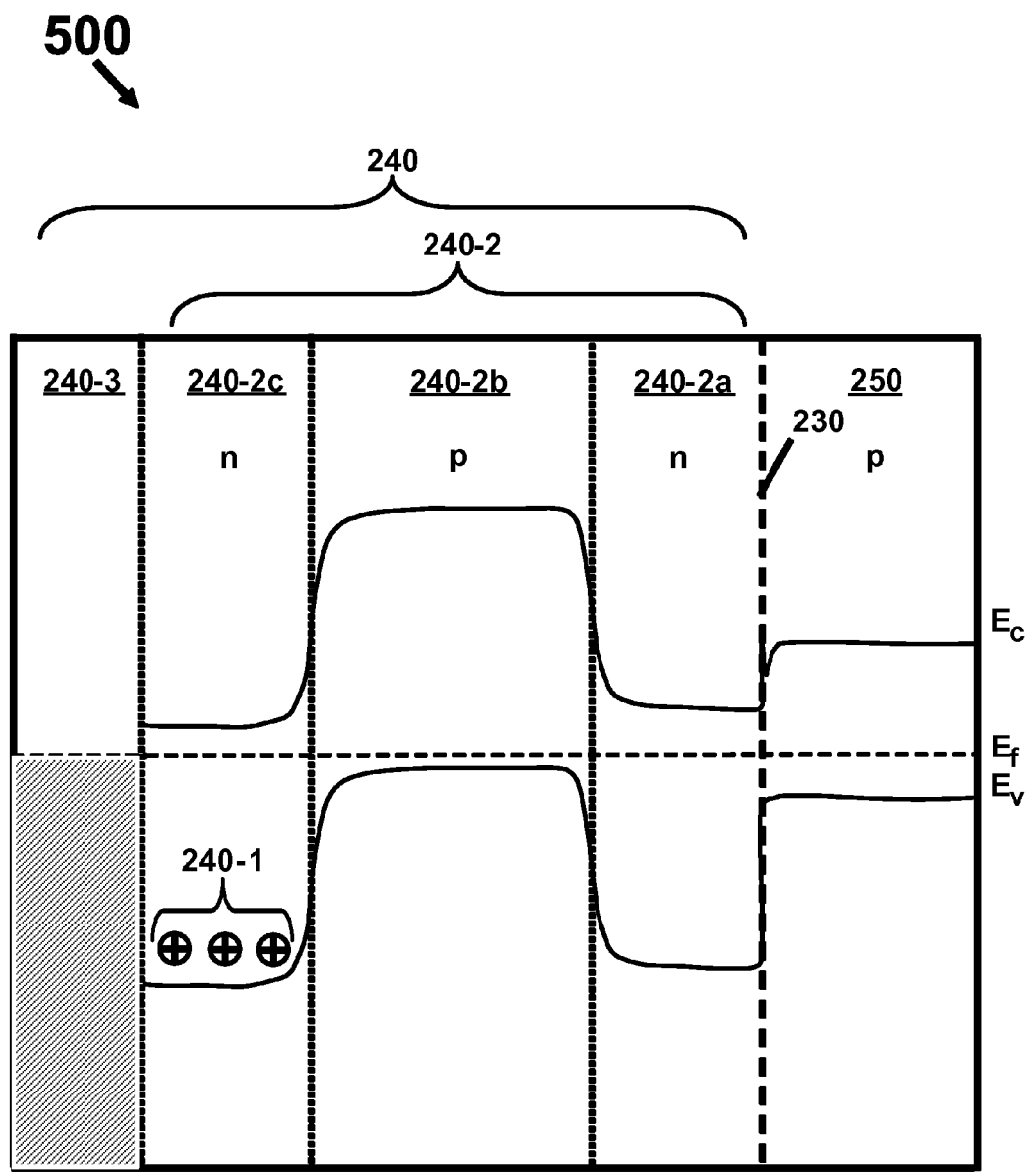
FIG. 5 is a cross-sectional elevation view of the channel-formation portion and the memristive gate in the example non-volatile field-effect device shown in FIG. 2 illustrating a band diagram showing the band structure of the confinement structure of the memristive gate in the example non-volatile field-effect device, and further illustrating location of a plurality of mobile ions in the confinement structure of the memristive gate for the low conductivity state of the channel-formation portion, in an embodiment of the present invention.

With reference now to FIG. 5, in accordance with an embodiment of the present invention, a cross-sectional elevation view 500 of the channel-formation portion 230 (indicated by the heavy dashed line) and the memristive gate 240 of the example non-volatile field-effect device 120 of FIGS. 2 and 3 is shown that is useful in describing in greater detail the effect of the plurality of mobile ions 240-1 on the non-volatility of the non-volatile field-effect device 120. Components of the non-volatile field-effect device 120 shown in FIG. 5 are denoted by reference numerals of components previously described in FIGS. 2, 3 and 4. FIG. 5 illustrates a band diagram showing band structure of the confinement structure 240-2 of the memristive gate 240 in the example non-volatile field-effect device 120 of FIGS. 2 and 3. FIG. 5 shows the location of the plurality of mobile ions 240-1 that are positively charged in the confinement structure 240-2 of the memristive gate 240 for the low conductivity state of the channel-formation portion 230, for the non-volatile field-effect device 120 configured as an n-channel enhancement mode FET, by way of example without limitation thereto. In accordance with an embodiment of the present invention, the plurality of mobile ions 240-1 may include ions selected from the group consisting of lithium ions and hydrogen ions. Moreover, the group of mobile ions may further include other relatively small positively charged ionic species such as: magnesium ions, and beryllium ions. In accordance with embodiments of the present invention, the plurality of mobile ions 240-1 may be deposited in the memristive gate 240 by a process selected from the group consisting of ion implantation, and co-deposition during deposition of material of the memristive gate. In accordance with other embodiments of the present invention, the gate electrode 240-3 may include a metal selected from the group consisting of gold and platinum. Moreover, the group of metals selected for the gate electrode 240-3 may further include metals such as: aluminum, or alternatively, other metals used for gate electrodes.

With further reference to FIG. 5, in accordance with an embodiment of the present invention, neglecting any substrate bias potentials, for the sake of simplicity, if the gate bias voltage, $V_G$, is negative, the plurality of mobile ions 240-1 that are positively charged will be attracted to the gate electrode 240-3, as shown in FIG. 5; under circumstances of an applied, negative gate bias voltage, $V_G$, the plurality of positively charged mobile ions 240-1 becomes confined within the third portion 240-2c of the confinement structure 240-2 of the memristive gate 240. However, after the gate bias voltage, $V_G$, has been removed, the plurality of positively charged mobile ions 240-1 remain confined within the third portion 240-2c of the confinement structure 240-2 of the memristive gate 240 due to the barrier potential at the junction between the second portion 240-2b and the third portion 240-2c, which gives rise to a hysteretic memory effect, referred to herein as a "memristive effect," which gives rise to the term of art, "memristive gate." As shown in FIG. 5, in accordance with embodiments of the present invention, negligible current flows between the source 210 and the drain 220 with application of a potential across the source 210 and the drain 220, because no channel is formed between the source 210 and the drain 220 in the non-volatile field-effect device 120 configured as an n-channel enhancement mode FET. Thus, for non-negligible current to flow between the source 210 and the drain 220, a potential is applied across the source 210 and the drain 220, and a channel exists between the source 210 and the drain 220 of the non-volatile field-effect device 120 configured as the n-channel enhancement mode FET, as is next described.

Figure 6:
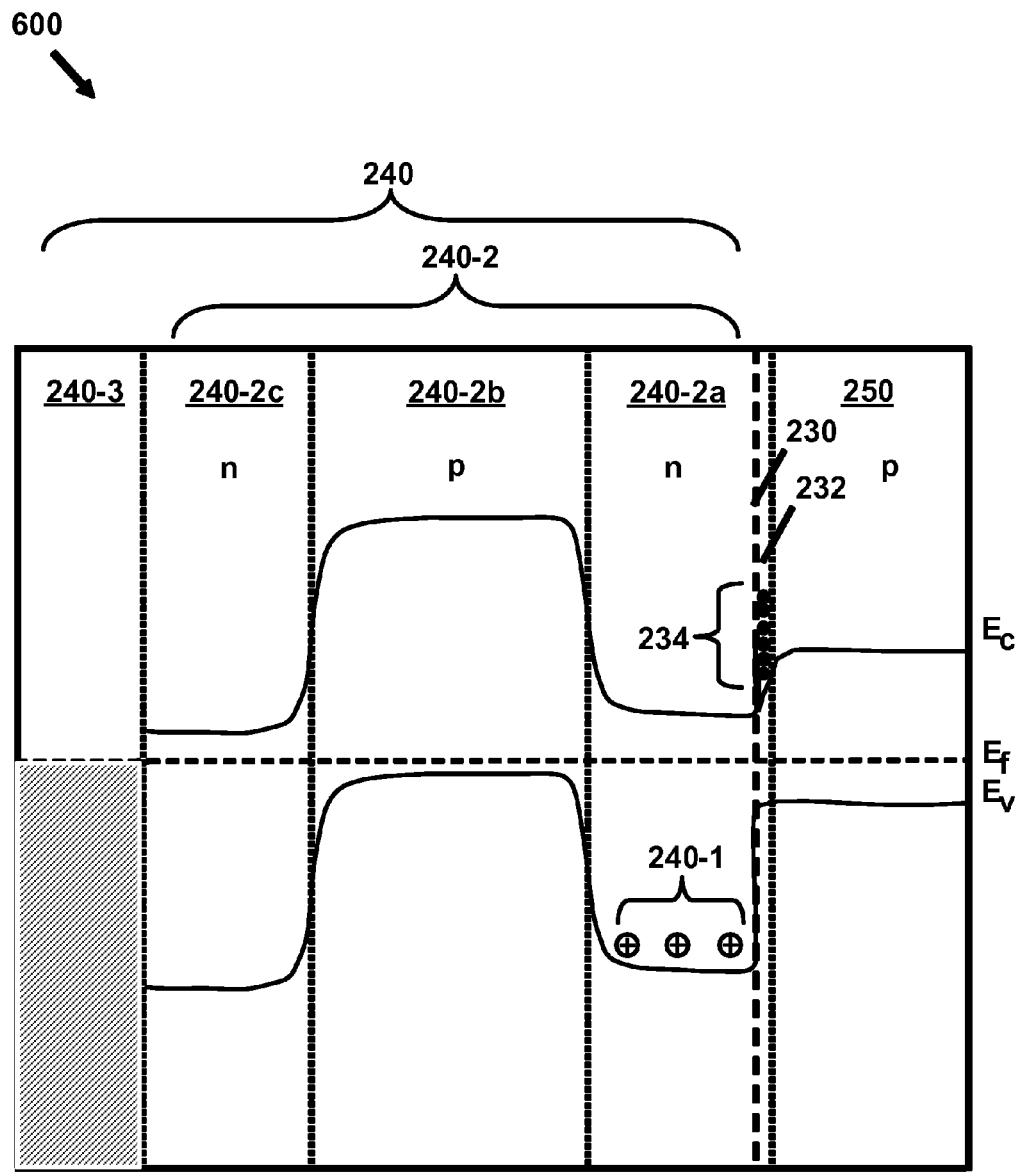
FIG. 6 is a cross-sectional elevation view of the channel-formation portion and the memristive gate in the example non-volatile field-effect device shown in FIG. 3 illustrating a band diagram showing the band structure of the confinement structure of the memristive gate in the example non-volatile field-effect device, and further illustrating location of a plurality of mobile ions in the confinement structure of the memristive gate for the high conductivity state of the channel-formation portion such that the plurality of mobile ions induces the formation of a surface inversion layer, or channel, with the accumulation of minority carriers in the channel, in an embodiment of the present invention.

With reference now to FIG. 6, in accordance with an embodiment of the present invention, a cross-sectional elevation view 600 of the channel-formation portion 230 (indicated by the heavy dashed line) and the memristive gate 240 of the example non-volatile field-effect device 120 of FIGS. 2 and 3 is shown that is useful in describing in greater detail the effect of the plurality of mobile ions 240-1 on the non-volatility of the non-volatile field-effect device 120. Components of the non-volatile field-effect device 120 shown in FIG. 6 are denoted by reference numerals of components previously described in FIGS. 2, 3, 4 and 5. FIG. 6 illustrates a band diagram showing band structure of the confinement structure 240-2 of the memristive gate 240 in the example non-volatile field-effect device 120 of FIGS. 2 and 3. FIG. 6 shows the location of the plurality of mobile ions 240-1 that are positively charged in the confinement structure 240-2 of the memristive gate 240 for the high conductivity state of the channel-formation portion 230, for the non-volatile field-effect device 120 configured as an n-channel enhancement mode FET, by way of example without limitation thereto. Neglecting any substrate bias potentials, for the sake of simplicity, if the gate bias voltage, $V_G$, is positive, the plurality of mobile ions 240-1 that are positively charged will be repelled from the gate electrode 240-3, as shown in FIG. 6; under circumstances of an applied, positive gate bias voltage, $V_G$, the plurality of positively charged mobile ions 240-1 becomes confined within the first portion 240-2a of the confinement structure 240-2 of the memristive gate 240. In accordance with embodiments of the present invention, the plurality of charged mobile ions 240-1 that are confined within the first portion 240-2a of the confinement structure 240-2 of the memristive gate 240 attract a plurality of minority carriers 234, which are electrons in the case of a substrate 250 that is p-type; the plurality of minority carriers 234 accumulate at the surface of the substrate 250 forming a surface inversion layer, which is channel 232, for the non-volatile field-effect device 120 configured as the n-channel enhancement mode FET. Thus, in accordance with embodiments of the present invention, a high conductivity state of the channel-formation portion 230 is produced by the channel 232 in the channel-formation portion 230 of the non-volatile field-effect device 120 configured as the n-channel enhancement mode FET. However, after the gate bias voltage, $V_G$, has been removed, the plurality of positively charged mobile ions 240-1 remain confined within the third portion 240-2c of the confinement structure 240-2 of the memristive gate 240 due to the barrier potential at the junction between the first portion 240-2a and the second portion 240-2b, which gives rise to the hysteretic memory effect, which is the memristive effect. As shown in FIG. 6, in accordance with embodiments of the present invention, if a potential is applied across the source 210 and the drain 220, a substantial current flows between the source 210 and the drain 220, because the channel 232 is formed between the source 210 and the drain 220 in the non-volatile field-effect device 120 configured as an n-channel enhancement mode FET, by way of example without limitation thereto.

With further reference to FIGS. 1, 2, 3, 5 and 6, in accordance with embodiments of the present invention, the gate electrode 240-3 is configured to apply an electric field that induces the plurality of mobile ions 240-1 to migrate to sites in the confinement structure 240-2 such that the channel-formation portion 230 switches from the first conductivity state associated with a first bit state of the non-volatile memory cell 130 to the second conductivity state associated with a second bit state of the non-volatile memory cell 130 with migration of the plurality of mobile ions 240-1. These sites are identified with the first portion 240-2*a* and the third portion 240-2*c* of the confinement structure 240-2 of the memristive gate 240. The bit states so stored in the non-volatile memory cell 130 are non-volatile, because bit states remain stored in the non-volatile memory cell 130 in the absence of power being applied to the non-volatile RAM, or IC, in which the non-volatile memory cell 130 is incorporated. Moreover, the non-volatile field-effect device 120 of the non-volatile memory cell 130 is compatible with complementary-metal-oxide-semiconductor (CMOS) silicon integrated circuitry so that integrated circuitry of a non-volatile RAM 110, or alternatively, other IC, which incorporates the non-volatile field-effect device 120, may include CMOS silicon integrated circuitry.

The foregoing descriptions of specific embodiments of the present invention have been presented for purposes of illustration and description. They are not intended to be exhaustive or to limit the technology to the precise forms disclosed, and many modifications and variations are possible in light of the above teaching. The embodiments described herein were chosen and described in order to best explain the principles of the technology and its practical application, to thereby enable others skilled in the art to best utilize the technology and various embodiments with various modifications as are suited to the particular use contemplated. It may be intended that the scope of the technology be defined by the claims appended hereto and their equivalents.

What is claimed is:

1. A non-volatile field-effect device, comprising:
    a source;
    a drain;
    a channel-formation portion disposed between and coupled with said source and said drain; and
    a memristive gate disposed over said channel-formation portion and coupled with said channel-formation portion;
    wherein said memristive gate comprises a plurality of mobile ions and a confinement structure for said plurality of mobile ions; and said memristive gate is configured to switch said channel-formation portion from a first conductivity state to a second conductivity state in response to migration of said plurality of mobile ions within said confinement structure.

2. The non-volatile field-effect device of claim 1, wherein said confinement structure comprises a semiconductor heterojunction structure.

3. The non-volatile field-effect device of claim 1, wherein said memristive gate further comprises:
    a gate electrode; and
    said confinement structure comprising:
        a first portion, said first portion disposed in proximity to said channel-formation portion;
        a third portion, said third portion disposed in proximity to said gate electrode; and
        a second portion, said second portion disposed between said first portion and said third portion;
        wherein said first portion and said third portion comprise memristive semiconductors doped to produce portions of a first conductivity type, and said second portion comprises a memristive semiconductor doped to produce a portion of a second conductivity type.

4. The non-volatile field-effect device of claim 3, wherein said confinement structure further comprises:
    a first portion comprising a n-doped memristive semiconductor;
    a second portion comprising a p-doped memristive semiconductor; and
    a third portion comprising a n-doped memristive semiconductor.

5. The non-volatile field-effect device of claim 3, wherein said confinement structure further comprises:
    a first portion comprising a p-doped memristive semiconductor;
    a second portion comprising a n-doped memristive semiconductor; and
    a third portion comprising a p-doped memristive semiconductor.

6. The non-volatile field-effect device of claim 3, wherein said first portion and said third portion further comprise titanium oxide doped with sodium; and said second portion comprises titanium oxide doped with nickel oxide.

7. The non-volatile field-effect device of claim 3, wherein said confinement structure further comprises at least one memristive semiconductor selected from the group consisting of titanium oxide, nickel oxide, zirconium oxide, hafnium oxide, strontium titanate, gallium nitride and cuprous chloride.

8. The non-volatile field-effect device of claim 3, wherein said gate electrode further comprises a metal selected from the group consisting of gold and platinum.

9. The non-volatile field-effect device of claim 1, wherein said plurality of mobile ions further comprise ions selected from the group consisting of lithium ions and hydrogen ions.

10. The non-volatile field-effect device of claim 9, wherein said plurality of mobile ions are deposited in said memristive gate by a process selected from the group consisting of ion implantation, and co-deposition during deposition of material of said memristive gate.

11. The non-volatile field-effect device of claim 1, further comprising:
    a substrate, said substrate comprising a substrate material, said substrate material selected from the group consisting of silicon, gallium arsenide, indium antimonide, and silicon germanium;
    wherein said source, said drain and said channel-formation portion are fabricated in said substrate.

12. A non-volatile memory cell, comprising:
    at least one non-volatile field-effect device comprising:
        a source;
        a drain;
        a channel-formation portion disposed between and coupled with said source and said drain; and
        a memristive gate disposed over said channel-formation portion and coupled with said channel-formation portion;
        wherein said memristive gate comprises a plurality of mobile ions and a confinement structure for said plurality of mobile ions; and said memristive gate is configured to switch said channel-formation portion from a first conductivity state to a second conductivity state in response to migration of said plurality of mobile ions within said confinement structure; and
    an input lead, said input lead coupled to said memristive gate; and
    an output lead, said output lead coupled to one of said source and said drain.

13. The non-volatile memory cell of claim 12, wherein said memristive gate further comprises:
a gate electrode, said gate electrode configured to apply an electric field that induces said plurality of mobile ions to migrate to sites in said confinement structure such that said channel-formation portion switches from said first conductivity state associated with a first bit state of said non-volatile memory cell to said second conductivity state associated with a second bit state of said non-volatile memory cell with migration of said plurality of mobile ions.

14. A non-volatile random access memory, comprising:
at least one non-volatile memory cell, comprising:
at least one non-volatile field-effect device comprising:
a source;
a drain;
a channel-formation portion disposed between and coupled with said source and said drain; and
a memristive gate disposed over said channel-formation portion and coupled with said channel-formation portion;
wherein said memristive gate comprises a plurality of mobile ions and a confinement structure for said plurality of mobile ions; and said memristive gate is configured to switch said channel-formation portion from a first conductivity state to a second conductivity state in response to migration of said plurality of mobile ions within said confinement structure; and
an input lead, said input lead coupled to said memristive gate; and
an output lead, said output lead coupled to one of said source and said drain; and
integrated circuitry.

15. The non-volatile random access memory of claim 14, wherein said integrated circuitry of said non-volatile random access memory further comprises complementary-metal-oxide-semiconductor (CMOS) silicon integrated circuitry.

* * * * *